(12) United States Patent
Aso et al.

(10) Patent No.: US 12,372,557 B2
(45) Date of Patent: Jul. 29, 2025

(54) EXCITATION CURRENT DETECTION CIRCUIT AND SEMICONDUCTOR DEVICE

(71) Applicant: SANKEN ELECTRIC CO., LTD., Niiza (JP)

(72) Inventors: Shinji Aso, Niiza (JP); Toshihiro Nakano, Niiza (JP); Mitsutomo Yoshinaga, Niiza (JP); Hiroshi Hosoya, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 182 days.

(21) Appl. No.: 18/346,893

(22) Filed: Jul. 5, 2023

(65) Prior Publication Data

US 2024/0061020 A1  Feb. 22, 2024

(30) Foreign Application Priority Data

Aug. 19, 2022 (JP) .................. 2022-131032

(51) Int. Cl.
*G01R 15/18* (2006.01)
*G01R 19/00* (2006.01)
*H02J 50/10* (2016.01)

(52) U.S. Cl.
CPC ......... *G01R 15/18* (2013.01); *G01R 19/0046* (2013.01)

(58) Field of Classification Search
CPC ....... G01R 19/2506; H02J 50/10; H01F 27/38
See application file for complete search history.

(56) References Cited

U.S. PATENT DOCUMENTS

| | | | | |
|---|---|---|---|---|
| 2002/0036598 A1* | 3/2002 | Shibata | ..................... | G09G 1/04 345/11 |
| 2006/0034102 A1* | 2/2006 | Yang | ................. | H02M 3/33507 363/21.13 |
| 2009/0086513 A1* | 4/2009 | Lombardo | ........ | H02M 3/33507 363/21.01 |
| 2011/0157922 A1* | 6/2011 | Konecny | ........... | H02M 3/33515 363/21.12 |

(Continued)

FOREIGN PATENT DOCUMENTS

| | | |
|---|---|---|
| EP | 3726716 A1 | 10/2020 |
| JP | 4831010 B2 | 12/2011 |

*Primary Examiner* — Huy Q Phan
*Assistant Examiner* — Temilade S Rhodes-Vivour
(74) *Attorney, Agent, or Firm* — METROLEX IP LAW GROUP, PLLC; Robert L. Scott, Esq.

(57) ABSTRACT

An excitation current detection circuit is disclosed. A transformer comprises a primary winding, an auxiliary winding, and a secondary winding. A first voltage detector detects a positive voltage of an auxiliary winding voltage. A second voltage detector detects a negative voltage of the auxiliary winding voltage. A first voltage controlled oscillator generates a first clock with a frequency proportional to the positive voltage during a period when the auxiliary winding voltage is the positive voltage. A second voltage controlled oscillator generates a second clock with a frequency proportional to the negative voltage during a period when the auxiliary winding voltage is the negative voltage. A counter outputs a counter value, which is added in one of cycles of the first clock and the second clock and subtracted in the other cycle of the first clock and the second clock as a detected value of an excitation current.

6 Claims, 6 Drawing Sheets

(56) References Cited

U.S. PATENT DOCUMENTS

2012/0106208 A1* 5/2012 Sugawara ......... H02M 3/33523
                                              363/21.13
2017/0237356 A1* 8/2017 Chen ................. H02M 3/33553
                                              363/21.02

* cited by examiner

US 12,372,557 B2

EXCITATION CURRENT DETECTION CIRCUIT AND SEMICONDUCTOR DEVICE

CROSS REFERENCE TO RELATED APPLICATIONS

This application claims priority to prior Japanese Patent Application No. 2022-131032 filed with the Japan Patent Office on Aug. 19, 2022, the entire contents of which are incorporated herein by reference.

BACKGROUND

The disclosure relates to an excitation current detection circuit that detects an excitation current of a transformer.

A technique is disclosed for detecting the excitation current of a transformer during a period when a current is being released to a secondary side of a flyback converter, using an auxiliary winding voltage value generated in an auxiliary winding in the flyback converter including a primary side and a secondary side isolated from the primary side.

Japanese Patent No. 4831010 discloses an integrating circuit that time-integrates a difference voltage value between an input voltage value given to a primary winding and the auxiliary winding voltage value produced in the auxiliary winding and outputs a voltage value proportional to the current flowing in the primary winding.

However, in the related art, time integration is performed by an integrating circuit using a capacitor. When a control IC of the flyback converter is configured with a semiconductor integrated circuit, the capacitance of the capacitor used in an integrator may not be large. Therefore, an integrating circuit using a capacitor may not provide good accuracy due to low noiseproof and large variations.

An active clamp flyback converter disclosed in European Patent No. 3726716 controls a clamp switch that detects the excitation current of a transformer. However, with the conventional technology, it is difficult to achieve an accuracy required by the control IC of the active clamp flyback converter.

SUMMARY

An excitation current detection circuit according to one or more embodiments may include: a transformer comprising a primary winding and an auxiliary winding on a primary side, and a secondary winding on a secondary side; a first voltage detector that detects a positive voltage of an auxiliary winding voltage generated in the auxiliary winding; a second voltage detector that detects a negative voltage of the auxiliary winding voltage generated in the auxiliary winding; a first voltage controlled oscillator that generates a first clock with a frequency proportional to the positive voltage during a period when the auxiliary winding voltage is the positive voltage; a second voltage controlled oscillator that generates a second clock with a frequency proportional to the negative voltage during a period when the auxiliary winding voltage is the negative voltage; and a counter that outputs a counter value, which is added in one of cycles of the first clock and the second clock and subtracted in the other cycle of the first clock and the second clock as a detected value of an excitation current.

An excitation current detection circuit according to one or more embodiment may include: a transformer comprising a primary winding and an auxiliary winding on a primary side and a secondary winding on a secondary side; a first voltage detector that samples and detects an auxiliary winding voltage generated in the auxiliary winding after a first delay time from a transition to an ON state of a switch connected in series with the primary winding; a second voltage detector that samples and detects the auxiliary winding voltage generated in the auxiliary winding after a second delay time from a transition to an OFF state of the switch;

a first voltage controlled oscillator that generates a first clock with a frequency proportional to the auxiliary winding voltage detected by the first voltage detector; a second voltage controlled oscillator that generates a second clock with a frequency proportional to the auxiliary winding voltage detected by the second voltage detector; and a counter that outputs a counter value, which is added or subtracted in a first clock cycle when the switch is in the ON state and subtracted or added in a second clock cycle when the switch is in the OFF state as a detected value of an excitation current.

DETAILED DESCRIPTION

An excitation current detection circuit and a semiconductor device according to one or more embodiments are described below with reference to drawings.

First Variation

Figure 1:
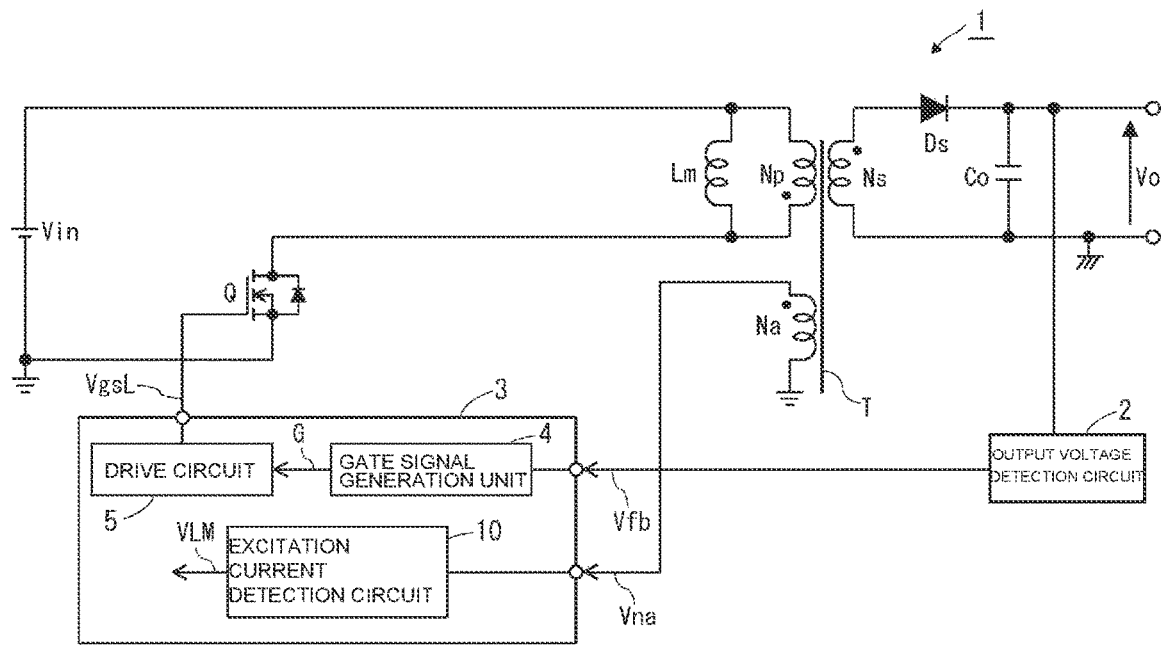
FIG. 1 is a configuration diagram illustrating a flyback converter with a first variation of an excitation current detection circuit according to one or more embodiments.

FIG. 1 is a block diagram illustrating an excitation current detection circuit according to one or more embodiments. An excitation current detection circuit 10 is applicable to a power supply device that sends power from a primary side to a secondary side via a transformer T. The excitation current detection circuit 10 illustrated in FIG. 1 is provided in a control circuit 3 of a flyback converter 1.

The flyback converter 1 includes a transformer T, a switch Q, a diode Ds, an output capacitor Co, and an output voltage detection circuit 2.

The transformer T includes a primary winding Np and an auxiliary winding Na on a primary side and a secondary winding Ns on a secondary side. A beginning of the primary winding Np and the beginning of the secondary winding Ns are wound in opposite phases of each other, and an excitation inductance Lm is included on a primary winding Np side. In FIG. 1, the auxiliary winding Na is a reverse phase of the primary winding Np, but a polarity of the auxiliary winding Na may be reversed. In this case, the polarity of the voltage generated by the auxiliary winding Na may be reversed in the following description.

A series circuit of the primary winding Np of the transformer T and the switch Q is connected to both ends of a DC power supply (input voltage Vin). The switch Q may include a MOSFET (Metal-oxide-semiconductor field-effect transistor), but may include an IGBT (insulated gate bipolar transistor), etc.

For the diode Ds, an anode is connected to one end of the secondary winding Ns of the transformer T and a cathode is connected to the other end of the secondary winding Ns of the transformer T via the output capacitor Co. In other words, a series circuit of the diode Ds and the output capacitor Co is electrically connected to both ends of the secondary winding Ns of the transformer T as a rectifying/smoothing circuit, and the voltage at both ends of the output capacitor Co is output as an output voltage Vo.

The output voltage detection circuit 2 detects the output voltage Vo and feeds back the detected output voltage Vo to the control circuit 3 as a feedback voltage Vfb via a photocoupler, etc., which is not illustrated in the drawing.

The control circuit 3 includes a semiconductor device such as a switching regulator IC (semiconductor integrated circuit) that drives the switch Q on and off so that the output voltage Vo becomes a desired value. The control circuit 3 may incorporate the switch Q.

The control circuit 3 includes a gate signal generation unit 4, and a drive circuit 5. The gate signal generation unit 4 generates a gate signal G that controls the switch Q on/off at a duty according to the feedback voltage Vfb. The drive circuit 5 drives the switch Q by applying a control voltage to a gate of the switch Q based on the gate signal G.

The control circuit 3 includes an excitation current detection circuit 10. The excitation current detection circuit 10 receives a voltage Vna of the auxiliary winding Na as input and outputs an excitation current detection value VLM.

Figure 2:
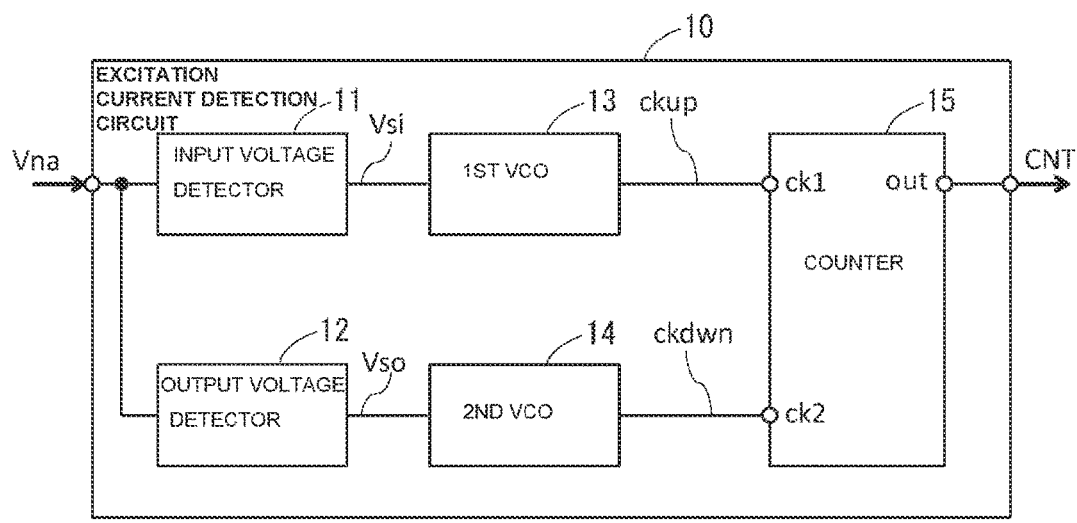
FIG. 2 is a configuration diagram illustrating an excitation current detection circuit such as is illustrated in FIG. 1.

The excitation current detection circuit 10 includes an input voltage detector 11, an output voltage detector 12, a first voltage controlled oscillator (first VCO) 13, a second voltage controlled oscillator (second VCO) 14, and a counter 15 as illustrated in FIG. 2.

The input voltage detector 11 detects a voltage Vsi proportional to the input voltage generated in the auxiliary winding Na. The output voltage detector 12 detects a voltage Vso proportional to the output voltage generated in the auxiliary winding Na.

Figure 3:
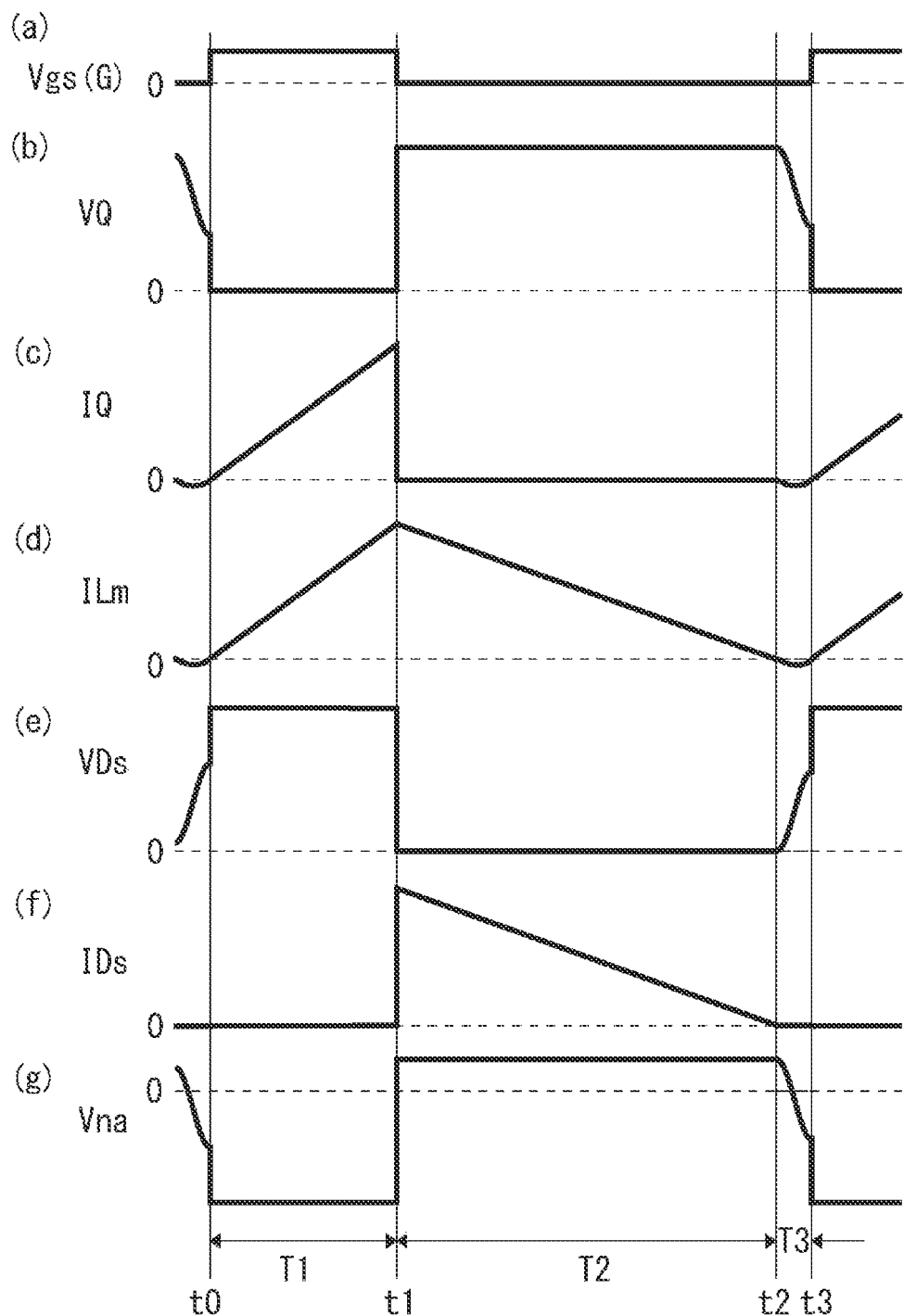
FIG. 3 is waveform diagrams illustrating each part of a flyback converter such as is illustrated in FIG. 1.

FIG. 3 is a waveform diagram illustrating each part of the excitation current detection circuit 10. From the top of FIG. 3, a signal (a) is a gate voltage Vgs (G) of the switch Q (gate signal G), a signal (b) is a drain-source voltage VQ of the switch Q, a signal (c) is a drain current IQ of the switch Q, a signal (d) is an excitation current ILm of the excitation inductance Lm, a signal (e) is a voltage VDs between terminals of the diode Ds, a signal (f) is a forward current IDs of the diode Ds, and a signal (g) is an auxiliary winding voltage Vna that is generated in the auxiliary winding Na, respectively.

In the signal (a) of FIG. 3, a period T1 during which the gate voltage of the switch Q is at a Hi level from a time t0 to a time t1 is an ON period of the switch Q. The excitation current ILm flows, and energy is accumulated in the primary winding Np and the secondary winding Ns. During the ON period, the diode Ds is reverse biased, and no current flows in the secondary side as illustrated in the signal (e). The excitation current ILm increases by Vin/Lm×t during the ON period when the switch Q is ON and the input voltage Vin is applied, as illustrated in the signal (c).

In the signal (a) of FIG. 3, when the gate voltage of the switch Q transitions to a Lo level at the time t1 and the switch Q is turned off, energy is transferred from the primary side to the secondary side, and the diode Ds is forward biased. Therefore, current flows to the secondary side as illustrated in the signal (f).

A period T2 from the time t1 to a time t2, when the energy transfer from the primary side to the secondary side is completed, is a discharge period. For the excitation current ILm, during a period when the switch Q is turned off and the excitation current is discharged to the secondary side (discharge period), the signal (d) of FIG. 3 decreases by N·Vo/Lm×t. N is a winding ratio between the primary winding Np and the secondary winding Ns (Np/Ns).

A period T3 from the time t2 to a time t3, when the gate voltage of the switch Q transitions to the Hi level and the switch Q is turned on, is an OFF period with no energy transfer.

Figure 4:
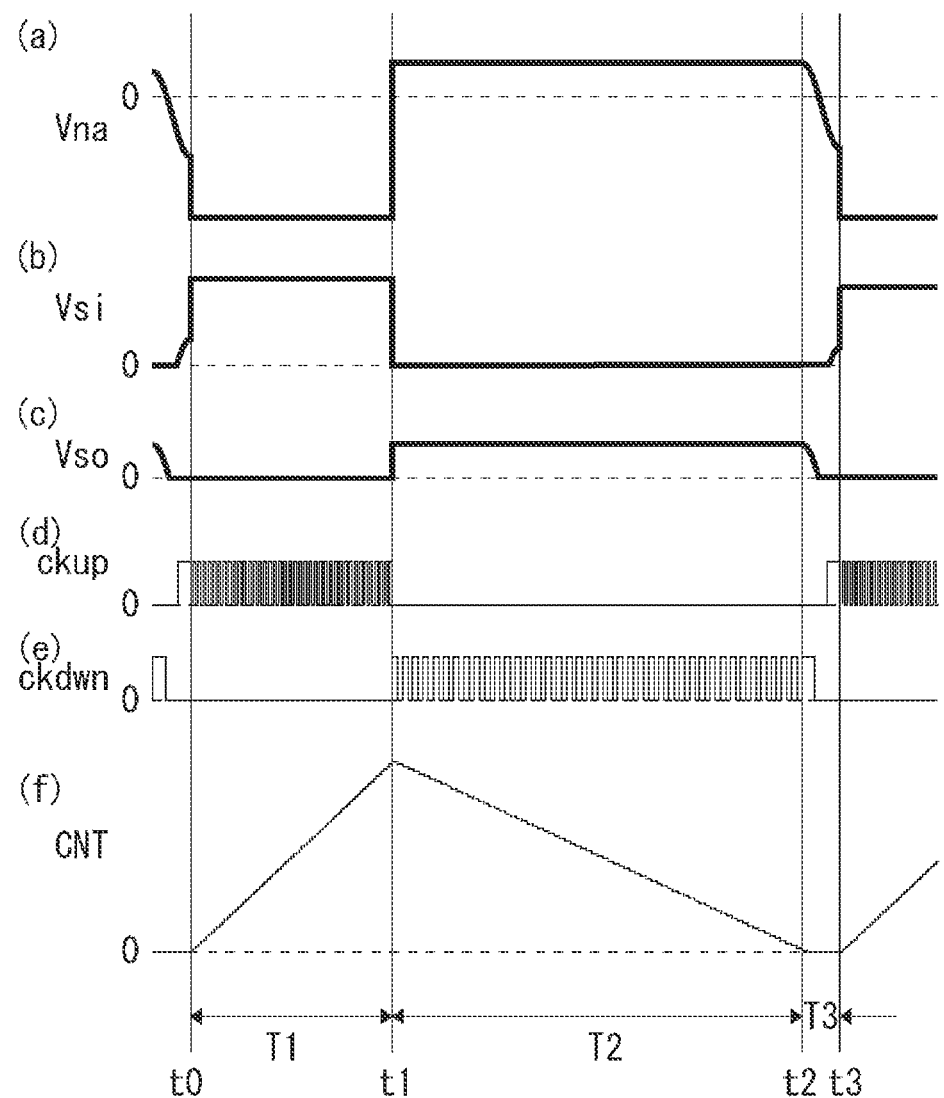
FIG. 4 is waveform diagrams illustrating each part of an excitation current detection circuit such as is illustrated in FIG. 2.

FIG. 4 is a waveform diagram of each part of the excitation current detection circuit 10. From the top of FIG. 4, a signal (a) is the auxiliary winding voltage Vna generated in the auxiliary winding Na, a signal (b) is the voltage Vsi proportional to the input voltage Vin, a signal (c) is the voltage Vso proportional to the output voltage Vo, a signal (d) is a first clock ckup output from the first voltage controlled oscillator 13, a signal (e)€ is a second clock ckdwn output from the second voltage controlled oscillator 14, and a signal (f) is a counter value CNT of the counter 15, respectively.

In the signal (a) of FIG. 4, the auxiliary winding voltage Vna generated in the auxiliary winding Na becomes the voltage Vsi, which is proportional to the input voltage Vin, during a negative period (the period T1 and a part of the period T3) and becomes the voltage Vso, which is proportional to an output voltage Vout, during a positive period (the period T2 and a part of the period T3).

Therefore, the input voltage detector 11 inversely amplifies the auxiliary winding voltage Vna and eliminates a negative voltage by half-wave rectification, and outputs only a positive voltage as the voltage Vsi proportional to the input voltage Vin, as illustrated in the signal (b) of FIG. 4. The output voltage detector 12 non-inverting amplifies the auxiliary winding voltage Vna at the same amplification ratio as the input voltage detector 11, eliminates the negative voltage by half-wave rectification, and outputs only the positive voltage as the voltage Vso proportional to the output voltage Vout, as illustrated in the signal (c) of FIG. 4.

The first voltage controlled oscillator 13 generates the first clock ckup with a frequency proportional to the voltage Vsi output from the input voltage detector 11. The first clock ckup is output during the period when the auxiliary winding voltage Vna generated in the auxiliary winding Na is negative (the period T1 and a part of the period T3), as illustrated in the signal (d) of FIG. 4.

The second voltage controlled oscillator 14 generates the second clock ckdwn with a frequency proportional to the voltage Vso output from the output voltage detector 12. The second clock ckdwn is output during the period when the auxiliary winding voltage Vna generated in the auxiliary winding Na is positive (the period T2 and a part of the period T3), as illustrated in the signal (e) of FIG. 4.

The counter 15 is a two-clock up-down counter, which adds a counter in a cycle of the first clock ckup input to a first clock terminal ck1 and subtracts a counter in a cycle of the second clock ckdwn input to a second clock terminal ck2.

The counter 15 outputs the counter value CNT from an output terminal out as a detected value of the excitation current ILm.

Since the first clock ckup has a frequency proportional to the input voltage Vin (voltage Vsi), the counter 15 is added in proportion to the excitation current ILm during the ON period, as illustrated in the signal (f) of FIG. 4. Since the second clock ckdwn has a frequency proportional to the output voltage Vout (voltage Vso), the counter 15 is subtracted in proportion to the excitation current ILm during the discharge period, as illustrated in the signal (f) of FIG. 4. Therefore, the counter value CNT output from the counter 15 is proportional to the excitation current ILm and is a highly accurate value corresponding to the excitation current ILm.

Figure 5A:
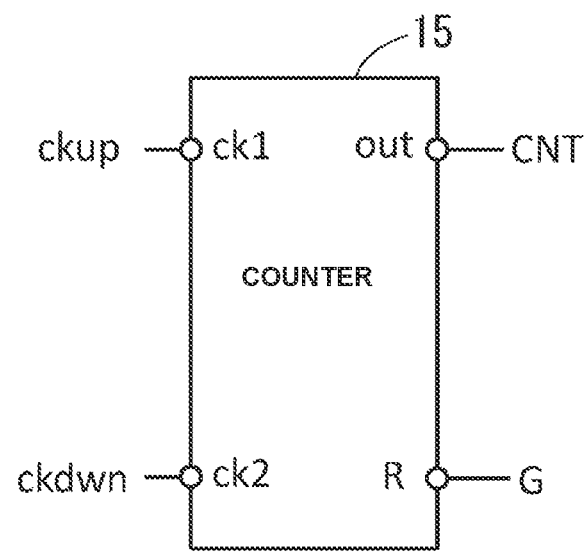
FIGS. 5A and 5B are block diagrams illustrating a counter according to one or more embodiments.

As illustrated in FIG. 5A, a reset terminal R may be provided in the counter 15 and reset so that the counter value CNT starts from "0" at the time t0 and the time t3, when the energy accumulation in the transformer T starts. A reset signal to be input to the reset terminal R may be reset at a timing of the transition to the Hi level using the gate signal G. When a detection of the excitation current ILm by the counter value CNT is used to control a clamp switch in an active clamp flyback converter, the reset signal may be generated by a control circuit of the clamp switch.

Second Variation

Figure 6:
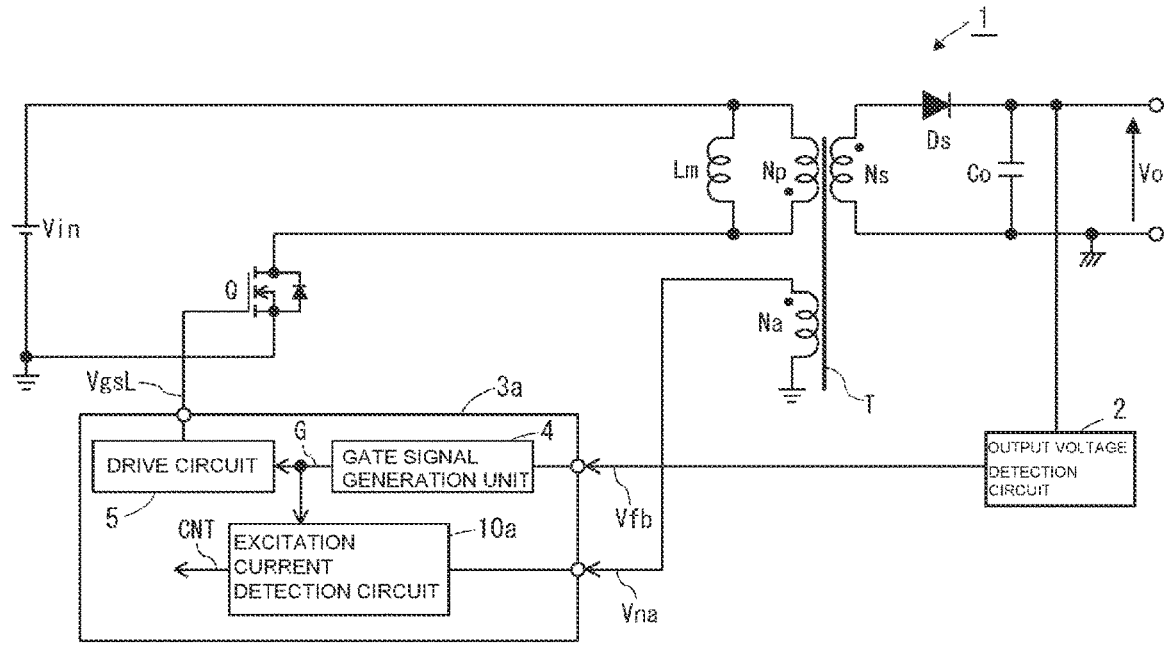
FIG. 6 is a configuration diagram illustrating a flyback converter with a second variation of the excitation current detection circuit according to one or more embodiments.

FIG. 6 illustrates a block diagram of an excitation current detection circuit 10a according to one or more embodiments. As illustrated in FIG. 6, the excitation current detection circuit 10a is included in a control circuit 3a of the flyback converter 1.

The control circuit 3a differs from the control circuit 3 of a first embodiment in that the gate signal G generated by the gate signal generation unit 4 is input to the excitation current detection circuit 10a.

Figure 7:
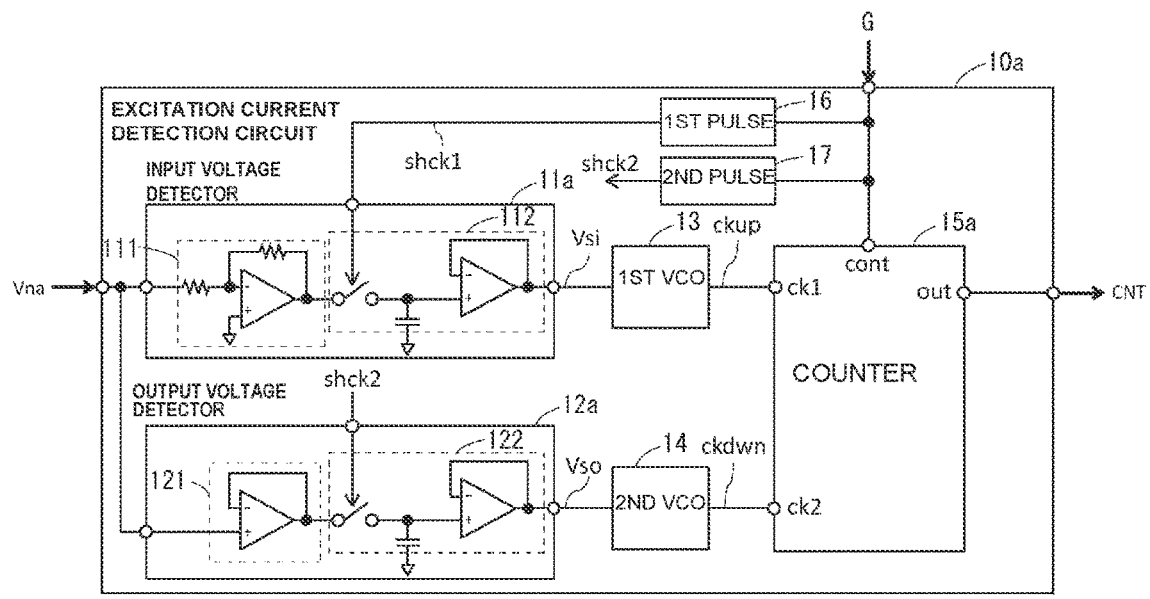
FIG. 7 is configuration diagram illustrating an excitation current detection circuit such as is illustrated in FIG. 6, for example.

The excitation current detection circuit 10a, as illustrated in FIG. 7, includes a first pulse generator (1st pulse) 16, a second pulse generator (2nd pulse) 17, an input voltage detector 11a, an output voltage detector 12a, the first voltage controlled oscillator (1st VCO) 13, the second voltage controlled oscillator (2nd VCO) 14, and a counter 15a.

Figure 8:
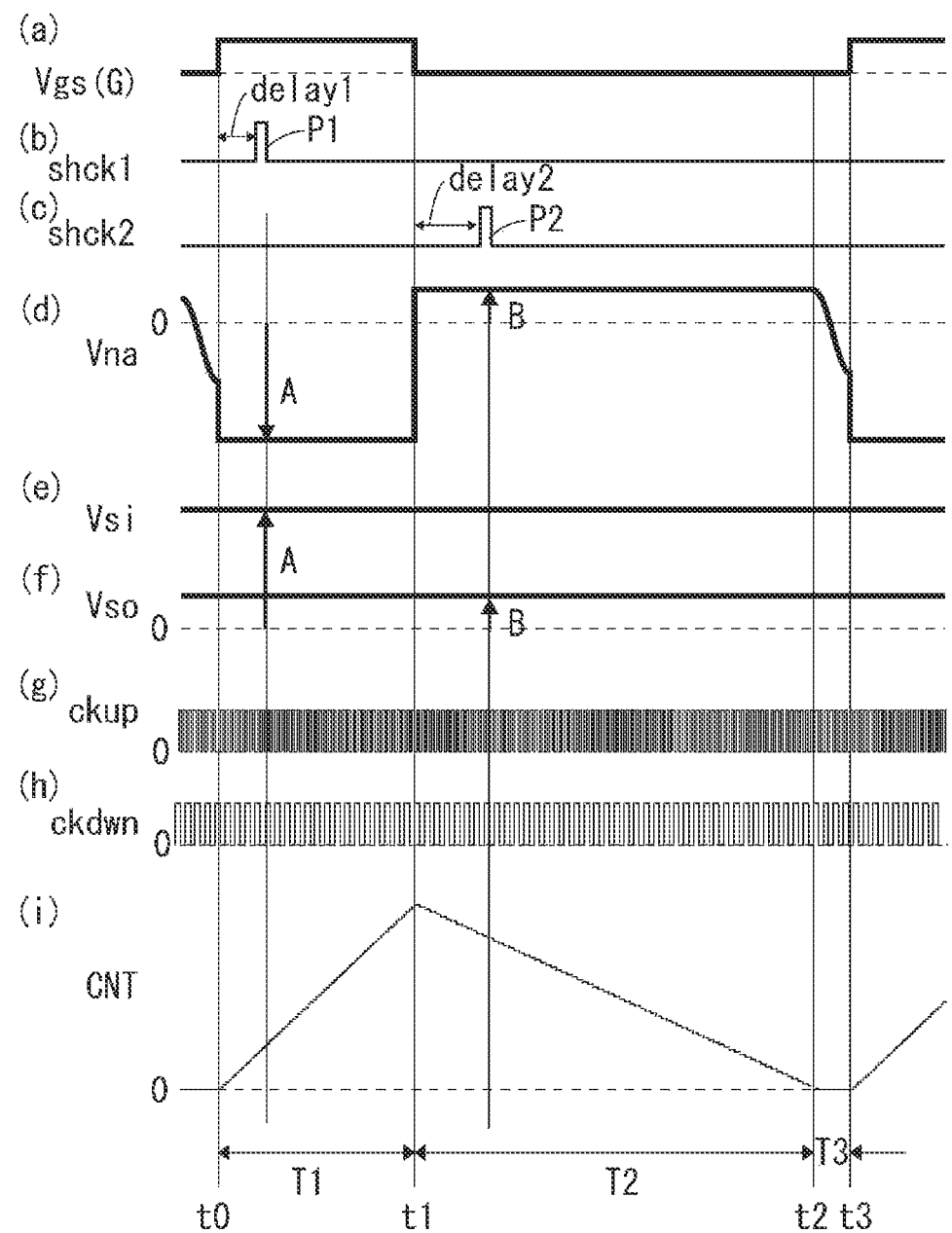
FIG. 8 is waveform diagrams of each part of an excitation current detection circuit such as is illustrated in FIG. 6.

FIG. 8 illustrates waveform diagrams of each part of the excitation current detection circuit 10a. From the top, a signal (a) is the gate voltage Vgs of the switch Q (gate signal G), a signal (b) is a pulse signal shck1, a signal (c) is a pulse signal shck2, a signal (d) is the auxiliary winding voltage Vna generated in the auxiliary winding Na, a signal (e) is the voltage Vsi proportional to the input voltage Vin, a signal (f) is the voltage Vso proportional to the output voltage Vo, a signal (g) is the first clock ckup output from the first voltage controlled oscillator 13, a signal (h) is the second clock ckdwn output from the second voltage controlled oscillator 14, and a signal (i) is the counter value CNT of the counter 15, respectively.

The first pulse generator 16 detects a rising edge of the gate signal G of the switch Q. As illustrated in the signal (b) of FIG. 8, the first pulse generator 16 generates the pulse signal shck1 that outputs a one shot pulse P1 after a preset first delay time delay1 and outputs the pulse signal shck1 to the first voltage controlled oscillator 13. The first delay time delay1 is set to be longer than the time until the auxiliary winding voltage Vna stabilizes after the switch Q is turned on by the rising edge of the gate signal G.

The second pulse generator 17 detects a falling edge of the gate signal G of the switch Q. As illustrated in the signal (c) of FIG. 8, the second pulse generator 17 generates the pulse signal shck2 that outputs a one shot pulse P2 after a preset second delay time delay2 and outputs the pulse signal shck2 to the second voltage controlled oscillator 14. The second delay time delay2 is set to be longer than the time until the auxiliary winding voltage Vna stabilizes after the switch Q is turned off by the falling edge of the gate signal G.

The input voltage detector 11a includes an inverting amplifier 111 and a sample and hold circuit 112. The input voltage detector 11a outputs the voltage Vsi proportional to the input voltage Vin to the first voltage controlled oscillator 13 using the auxiliary winding voltage Vna and the pulse signal shck1 as inputs. The inverting amplifier 111 inverts and amplifies the auxiliary winding voltage Vna. The sample and hold circuit 112 samples and holds the auxiliary winding voltage Vna inverted and amplified by the inverting amplifier 111 at the timing of the one shot pulse P1 in the pulse signal shck1 illustrated by arrows A in the signal (d) and the signal (e) of FIG. 8. A voltage of the absolute value of the negative voltage of the auxiliary winding voltage Vna is then detected and output as the voltage Vsi proportional to the input voltage Vin.

As a result, the voltage Vsi output from the input voltage detector 11a is a value based on the auxiliary winding voltage Vna in a stable state, avoiding the unstable auxiliary winding voltage Vna due to ringing immediately after the switch Q is turned on, etc.

The output voltage detector 12a includes a non-inverting amplifier 121 and a sample and hold circuit 122. The output voltage detector 12a outputs the voltage Vso proportional to the output voltage Vout to the second voltage controlled oscillator 14 using the auxiliary winding voltage Vna and the pulse signal shck2 as inputs. The non-inverting amplifier 121 amplifies the auxiliary winding voltage Vna at the same amplification ratio as the inverting amplifier 111 in the input voltage detector 11a. The sample and hold circuit 122 samples and holds the auxiliary winding voltage Vna amplified by the non-inverting amplifier 121 at the timing of the one shot pulse P2 in the pulse signal shck2 illustrated by arrows B in the signal (d) and the signal (f) of FIG. 8. The positive voltage of the auxiliary winding voltage Vna is then detected and output as the voltage Vso proportional to the output voltage Vout.

As a result, the voltage Vso output from the output voltage detector 12a is a value based on the auxiliary winding voltage Vna in a stable state, avoiding the unstable auxiliary winding voltage Vna due to ringing immediately after the switch Q is turned off, etc.

The first voltage controlled oscillator 13 generates the first clock ckup that has a frequency proportional to the voltage Vsi output from the input voltage detector 11a. Since the first clock ckup is generated based on the sampled and held auxiliary winding voltage Vna, as illustrated in the signal (g) of FIG. 8, the first clock ckup is output during the positive period of the auxiliary winding voltage Vna generated in the auxiliary winding Na (the period T2 and a part of the period T3) and also continuously output during the negative period (the period T1 and a part of the period T3).

The second voltage controlled oscillator 14 generates the second clock ckdwn that has a frequency proportional to the voltage Vso detected by the output voltage detector 12a. Since the second clock ckdwn is generated based on the sampled and held auxiliary winding voltage Vna, as illustrated in the signal (h) of FIG. 8, the second clock ckdwn is output during the positive period of the auxiliary winding voltage Vna generated in the auxiliary winding Na (the period T2 and a part of the period T3) and also continuously output during the negative period (the period T1 and a part of the period T3).

The counter 15a is a two-clock up-down counter and includes a control terminal cont that controls the addition and subtraction of the counter according to the state of the gate signal G. The counter 15a adds a counter in the cycle of the first clock ckup input to a first clock terminal ck1 when the gate signal G input to the control terminal cont is the Hi level, as illustrated in the signal (i) of FIG. 8. The counter 15a subtracts a counter in the cycle of the second clock ckdwn input to a second clock terminal ck2 when the gate signal G input to the control terminal cont is the Lo level, as illustrated in the signal (i) of FIG. 8. The counter 15 then outputs the counter value CNT from the output terminal out as the detected value of the excitation current ILm.

Since the first clock ckup is generated based on the stable auxiliary winding voltage Vna during the negative period, the counter value CNT of the counter 15a is added in proportion to the excitation current ILm even during the period when the auxiliary winding voltage Vna is unstable immediately after the switch Q is turned on. Since the second clock ckdwn is generated based on the stable auxiliary winding voltage Vna during the positive period, the counter value CNT of the counter 15a is subtracted in proportion to the excitation current ILm even during the period when the auxiliary winding voltage Vna is unstable immediately after the switch Q is turned off. Therefore, the counter value CNT output from the counter 15a is proportional to the excitation current ILm and is an even higher precision value corresponding to the excitation current ILm.

Figure 5B:
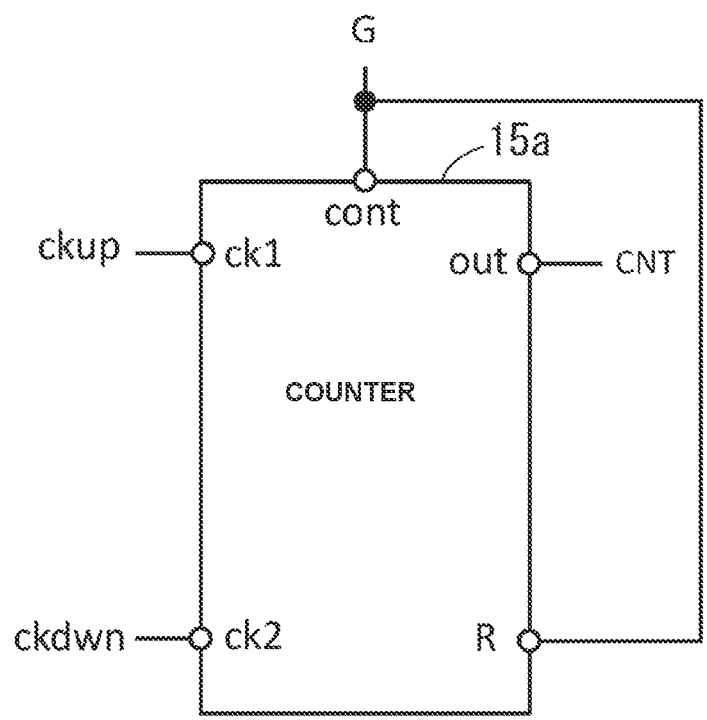

As illustrated in FIG. 5B, a reset terminal R may be provided in the counter 15a and reset so that the counter value CNT starts from "0" at the time t0 and the time t3, when the energy accumulation in the transformer T starts. A reset signal to be input to the reset terminal R may be reset at the timing of the transition to the Hi level using the gate signal G. When a detection of the excitation current ILm by the counter value CNT is used to control a clamp switch in an active clamp flyback converter, the reset signal may be generated by a control circuit of the clamp switch.

As described above, according to one or more embodiments, the excitation current detection circuit 10 for detecting the excitation current ILm of the transformer T with the primary winding Np and the auxiliary winding Na on the primary side and the secondary winding Ns on the secondary side includes the input voltage detector 11 that detects the positive voltage of the auxiliary winding voltage Vna generated in the auxiliary winding Na (the first voltage detector), the output voltage detector 12 that detects the negative voltage of the auxiliary winding voltage Vna generated in the auxiliary winding Na (the second voltage detector), the first voltage controlled oscillator 13 that generates the first clock ckup with a frequency proportional to the positive voltage during the period when the auxiliary winding voltage Vna is positive, the second voltage controlled oscillator 14 that generates the second clock ckdwn with a frequency proportional to the negative voltage during the period when the auxiliary winding voltage Vna is negative, and the counter 15 that outputs the counter value CNT that is added in one of the cycles of the first clock ckup or the second clock ckdwn and subtracted in the other cycles of the first clock ckup or the second clock ckdwn as the detected value of the excitation current ILm. With the configuration, the excitation current detection circuit 10 may be configured with a logic circuit, and the excitation current ILm of the transformer T may be detected accurately without using an integrating circuit with a capacitor of a large capacity. In addition, since the excitation current detection circuit 10 is configured with a logic circuit, the excitation current detection circuit 10 is easy to integrate and may be applied to a control IC for an active clamp flyback converter.

According to one or more embodiments, the excitation current detection circuit 10a for detecting the excitation current ILm of the transformer T with the primary winding Np and the auxiliary winding Na on the primary side and the secondary winding Ns on the secondary side includes the input voltage detector 11a (first voltage detector) that samples and detects the auxiliary winding voltage Vna generated in the auxiliary winding Na after the preset first delay time delay1 after the switch Q connected in series to the primary winding Np transitions to the ON state, the output voltage detector 12a (second voltage detector) that samples and detects the auxiliary winding voltage Vna generated in the auxiliary winding Na after the preset second delay time delay2 after the switch Q transitions to the OFF state, the first voltage controlled oscillator 13 that generates the first clock ckup with a frequency proportional to the auxiliary winding voltage Vna detected by the input voltage detector 11a, the second voltage controlled oscillator 14 that generates the second clock ckdwn with a frequency proportional to the auxiliary winding voltage Vna detected by the output voltage detector 12a, and the counter 15a that outputs the counter value CNT, which is added or subtracted in the cycle of the first clock ckup when the switch Q is ON and is subtracted or added in the cycle of the second clock ckdwn when the switch Q is OFF, as a detected value of the excitation current ILm. With the configuration, the excitation current detection circuit 10a may be configured with a logic circuit and does not use an integrating circuit with a large capacitor. Since the counter value CNT of the counter 15a is added or subtracted in proportion to the excitation current ILm even during the period when the auxiliary winding voltage Vna is unstable immediately after the switch Q is turned on or off, the excitation current ILm of the transformer T may be detected with even higher accuracy.

According to one or more embodiments, the counter 15 and the counter 15a include the reset terminal R. The counter value CNT of the counter 15 and the counter 15a is reset to start from "0" at the timing when the energy accumulation in the transformer T starts. The configuration may eliminate an error in the counter value CNT.

As explained above, the excitation current detection circuit and the semiconductor device according to one or more embodiments may accurately detect the excitation current of a transformer without using an integrating circuit with a large capacitor.

It is clear that the scope is not limited to the above embodiments, and each embodiment may be changed as appropriate within the scope of the technical concept. The number, position, shape, etc. of the above components are not limited to the above embodiments, but may be made to be any suitable number, position, shape, etc. The same component may be marked with the same symbol in each figure.

The invention claimed is:
1. An excitation current detection circuit comprising:
a transformer comprising a primary winding and an auxiliary winding on a primary side, and a secondary winding on a secondary side;
a first voltage detector that detects a positive voltage of an auxiliary winding voltage generated in the auxiliary winding, and outputs a first voltage proportional to the positive voltage;
a second voltage detector that detects a negative voltage of the auxiliary winding voltage generated in the aux- iliary winding, and outputs a second voltage proportional to the negative voltage;
a first voltage controlled oscillator that generates a first clock with a frequency proportional to the positive voltage during a period when the first voltage is output;
a second voltage controlled oscillator that generates a second clock with a frequency proportional to the negative voltage during a period when the second voltage is output; and
an up-down counter that outputs a counter value, which is added in one of cycles of the first clock and the second clock and subtracted in the other cycle of the first clock and the second clock as a detected value of an excitation current.

2. An excitation current detection circuit comprising:
a transformer comprising a primary winding and an auxiliary winding on a primary side and a secondary winding on a secondary side;
a first voltage detector that samples and detects an auxiliary winding voltage generated in the auxiliary winding as a first voltage after a first delay time from a transition to an ON state of a switch connected in series with the primary winding, and outputs a first output voltage proportional to the first voltage;
a second voltage detector that samples and detects the auxiliary winding voltage generated in the auxiliary winding as a second voltage after a second delay time from a transition to an OFF state of the switch, and outputs a second output voltage proportional to the second voltage;
a first voltage controlled oscillator that generates a first clock with a frequency proportional to the first output voltage output by the first voltage detector;
a second voltage controlled oscillator that generates a second clock with a frequency proportional to the second output voltage output by the second voltage detector; and
an up-down counter that outputs a counter value, which is added or subtracted in a first clock cycle when the switch is in the ON state and subtracted or added in a second clock cycle when the switch is in the OFF state as a detected value of an excitation current.

3. The excitation current detection circuit according to claim 1, wherein
the up-down counter comprises a reset terminal, and
the counter value of the up-down counter is reset to start from "0" at a timing when an accumulation of energy to the transformer is started.

4. The excitation current detection circuit according to claim 2, wherein
the up-down counter comprises a reset terminal, and
the counter value of the up-down counter is reset to start from "0" at a timing when an accumulation of energy to the transformer is started.

5. A semiconductor device comprising:
the excitation current detection circuit according to claim 1.

6. A semiconductor device comprising:
the excitation current detection circuit according to claim 2.

* * * * *